(12) United States Patent
Choi et al.

(10) Patent No.: US 10,886,943 B2
(45) Date of Patent: Jan. 5, 2021

(54) METHOD AND APPARATUS FOR VARIABLE RATE COMPRESSION WITH A CONDITIONAL AUTOENCODER

(71) Applicant: Samsung Electronics Co., Ltd., Gyeonggi-do (KR)

(72) Inventors: Yoo Jin Choi, San Diego, CA (US); Mostafa El-Khamy, San Diego, CA (US); Jungwon Lee, San Diego, CA (US)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/576,166

(22) Filed: Sep. 19, 2019

(65) Prior Publication Data

US 2020/0304147 A1  Sep. 24, 2020

Related U.S. Application Data

(60) Provisional application No. 62/860,522, filed on Jun. 12, 2019, provisional application No. 62/820,148, filed on Mar. 18, 2019.

(51) Int. Cl.
| | | |
|---|---|---|
| *H03M 7/30* | (2006.01) | |
| *H04N 19/147* | (2014.01) | |
| *G06N 3/08* | (2006.01) | |
| *G06N 3/04* | (2006.01) | |
| *H04N 19/19* | (2014.01) | |
| *H04N 19/13* | (2014.01) | |
| *H04L 1/00* | (2006.01) | |

(52) U.S. Cl.
CPC ............ *H03M 7/6011* (2013.01); *G06N 3/04* (2013.01); *G06N 3/08* (2013.01); *H04L 1/0003* (2013.01); *H04L 1/0009* (2013.01); *H04N 19/13* (2014.11); *H04N 19/147* (2014.11); *H04N 19/19* (2014.11)

(58) Field of Classification Search
CPC ... H03M 7/6011; H04N 19/13; H04N 19/147; H04N 19/19; G06N 3/04; G06N 3/08
See application file for complete search history.

(56) References Cited

U.S. PATENT DOCUMENTS

| | | | |
|---|---|---|---|
| 8,175,150 B1 * | 5/2012 | Zhang | H04N 19/19 |
| | | | 375/240 |
| 2002/0034333 A1 | 3/2002 | Vishwanath et al. | |
| | | (Continued) | |

FOREIGN PATENT DOCUMENTS

WO   WO 2013/056200   4/2013

OTHER PUBLICATIONS

E. Agustsson et al., Soft-to-hard vector quantization for end-to-end learning compressible representations. In Advances in Neural Information Processing Systems, . . . pp. 1141-1151, 2017.

(Continued)

*Primary Examiner* — Howard Williams
(74) *Attorney, Agent, or Firm* — The Farrell Law Firm, P.C.

(57) ABSTRACT

A method and apparatus for variable rate compression with a conditional autoencoder is herein provided. According to one embodiment, a method includes training a conditional autoencoder using a Lagrange multiplier and training a neural network that includes the conditional autoencoder with mixed quantization bin sizes.

20 Claims, 13 Drawing Sheets

(56) References Cited

U.S. PATENT DOCUMENTS

| | | | |
|---|---|---|---|
| 2011/0052087 A1* | 3/2011 | Mukherjee | H04N 19/14 |
| | | | 382/248 |
| 2011/0206110 A1 | 8/2011 | Bivolarsky et al. | |
| 2014/0294315 A1 | 10/2014 | Yang et al. | |
| 2016/0119624 A1 | 4/2016 | Frishman | |
| 2016/0227212 A1 | 8/2016 | Wang et al. | |
| 2019/0045195 A1 | 2/2019 | Gokhale et al. | |
| 2019/0279090 A1* | 9/2019 | Bose | G06N 3/084 |
| 2020/0097829 A1* | 3/2020 | Deng | G06F 7/5443 |
| 2020/0104640 A1* | 4/2020 | Poole | G06N 3/084 |

OTHER PUBLICATIONS

J. Ball'e et al., End-to-end optimized image compression. In International Conference on Learning Representations, 2017, pp. 27.

J. Ball'e et al.. Variational image compression with a scale hyperprior. In International Conference on Learning Representations, 2018, pp. 23.

F. Bellard. BPG image format. https://bellard.org/bpg, 2014, pp. 2.

V. K. Goyal. Theoretical foundations of transform coding. IEEE Signal Processing Magazine, 18(5):9-21, 2001.

N. Johnston et al., Improved lossy image compression with priming and spatially adaptive bit rates for recurrent networks. In Proceedings of the IEEE Conference on Computer . . . Vision and Pattern Recognition, pp. 4385-4393, 2018.

Y. LeCun et al.. Deep learning. Nature, 521(7553):436-444, 2015.

J. Lee et al., Context-adaptive entropy model for end-to-end optimized image compression. In International Conference on Learning Representations, 2019, pp. 20.

F. Mentzer et al., Conditional probability models for deep image compression. In Proceedings of the IEEE Conference on Computer Vision and Pattern Recognition, . . . pp. 4394-4402, 2018.

D. Minnen, et al.. Joint autoregressive and hierarchical priors for learned image compression. In Advances in Neural Information Processing Systems, pp. 10794-10803, 2018.

O. Rippel et al.. Real-time adaptive image compression. In Proceedings of the International Conference on Machine Learning, pp. 2922-2930, 2017.

K. Sohn, et al.. Learning structured output representation using deep conditional generative models. In Advances in Neural Information Processing Systems, . . . pp. 3483-3491, 2015.

G. J. Sullivan, et al.. Overview of the high efficiency video coding (hevc) standard. IEEE Transactions on Circuits and Systems for Video Technology, 22(12):1649-1668, 2012.

L. Theis, et al.. Lossy image compression with compressive autoencoders. In International Conference on Learning Representations, 2017, pp. 19.

G. Toderici et al., Full resolution image compression with recurrent neural networks. In Proceedings of the IEEE Conference on Computer Vision and Pattern Recognition, . . . pp. 5306-5314, 2017.

J. Tomczak et al., VAE with a VampPrior. In International Conference on Artificial Intelligence and Statistics, pp. 1214-1223, 2018.

A. Van den Oord, et al. Conditional image generation with PixelCNN decoders. In Advances in Neural Information Processing Systems, pp. 4790-4798, 2016.

G. K. Wallace. The JPEG still picture compression standard. IEEE Transactions on Consumer Electronics, 38(1):xviii-xxxiv, 1992, pp. 17.

R. Zamir et al., On universal quantization by randomized uniform/ lattice quantizers. IEEE Transactions on Information Theory, 38(2):428-436, 1992.

J. Ziv. on universal quantization. IEEE Transactions on Information Theory, 31(3):344-347, 1985.

J. Ball'e et al., Density modeling of images using a generalized normalization transformation. In International Conference on Learning Representations, 2016, pp. 14.

D. Kingma et al., Adam: A method for stochastic optimization. arXiv preprint arXiv:1412.6980, 2014, pp. 15.

O. Russakovsky et al., ImageNet large scale visual recognition challenge.International Journal of Computer Vision, 115(3):211-252, 2015.

Y. Choi et al.. Universal deep neural network compression. In NeurIPS Workshop on Compact Deep Neural Network Representation with Industrial Applications (CDNNRIA), . . . 2018, pp. 5.

D. P. Kingma et al.. Auto-encoding variational Bayes. In International Conference on Learning Representations, 2014, pp. 14.

E. Kodak. Kodak lossless true color image suite (PhotoCD PCD0992). http://r0k.us/graphics/kodak, 1993, pp. 3.

Z. Wang, et al., Multiscale structural similarity for image quality assessment. In Asilomar Conference on Signals, Systems & Computers, vol. 2, 1398-1402. IEEE, 2003.

M. Rabbani. JPEG2000: Image compression fundamentals, standards and practice. Journal of Electronic Imaging, 11(2):286, 2002, pp. 2.

* cited by examiner

METHOD AND APPARATUS FOR VARIABLE RATE COMPRESSION WITH A CONDITIONAL AUTOENCODER

PRIORITY

This application is based on and claims priority under 35 U.S.C. § 119(e) to U.S. Provisional Patent Application filed on Mar. 18, 2019 in the United States Patent and Trademark Office and assigned Ser. No. 62/820,148, and to U.S. Provisional Patent Application filed on Jun. 12, 2019 in the United States Patent and Trademark Office and assigned Ser. No. 62/860,522, the entire contents of which are incorporated herein by reference.

FIELD

The present disclosure is generally related to data compression. In particular, the present disclosure is related to a method and apparatus compression using a conditional autoencoder.

BACKGROUND

Variable rate compression may utilize neural network functionality and may be applied in various fields, including but not limited to image compression and radio frequency integrated circuit (RFIC) output compression.

Image compression is an application of data compression for digital images to lower their storage and/or transmission requirements. Transform coding may be used to yield image compression algorithms such as Joint Photographic Experts Group (JPEG) and JPEG2000. Such transform coding converts an input to a latent representation in a transform domain where lossy compression (that is typically a combination of quantization and lossless source coding) is more amenable and more efficient. For example, JPEG utilizes the discrete cosine transform (DCT) to convert an image into a sparse frequency domain representation. JPEG2000 replaces DCT with an enhanced discrete wavelet transform.

Deep learning may provide improved performance in various computer vision tasks. Along with this revolutionary progress of deep learning, learning-based image compression also has gained interests. In particular, non-linear transform coding designed with deep neural networks has advanced to outperform the classical image compression codecs sophisticatedly designed and optimized by domain experts, e.g., better portable graphics (BPG), which is a still image version of the high efficiency video codec (HEVC) standard. Typical learning-based image compression schemes provide BPG codec on peak signal-to-noise ratio (PSNR), a metric based on mean squared error (MSE).

A typical autoencoder based image compression framework optimizes the weighted combination of the rate-distortion (R-D) pair using the method of Lagrange multipliers. To adapt the quality (or the rate) of compressed images, multiple models are trained separately for different values of the Lagrange multiplier. That is, a typical system trains and deploys multiple models for rate adaptation, or retains a model while varying Lagrange multiplier, which may be impractical when it is desired to cover a broad range of the R-D curve with fine resolution and the size of each network is large.

SUMMARY

According to one embodiment, a method includes training a conditional autoencoder using a Lagrange multiplier and training a neural network that includes the conditional autoencoder with mixed quantization bin sizes.

According to one embodiment, a system includes a neural network including a conditional autoencoder, and a processor configured to train the conditional autoencoder using a Lagrange multiplier and train the neural network using mixed quantization bin sizes.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1A:
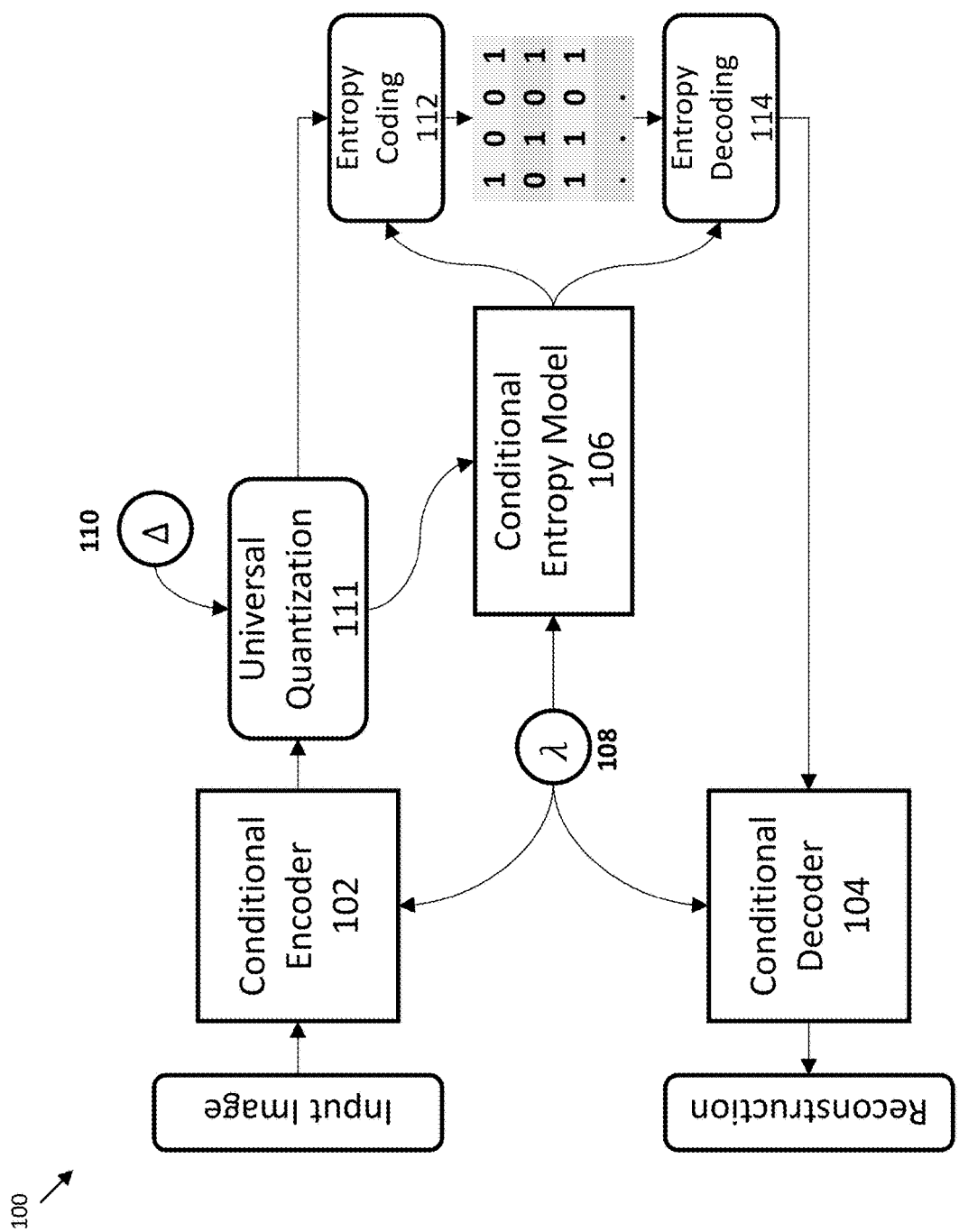
FIG. 1A illustrates a diagram of a variable-rate image compression model, according to an embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "1$^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

Variable rate compression may utilize neural network functionality and may be applied in various fields, including but not limited to image compression and radio frequency integrated circuit (RFIC) output compression.

According to one embodiment, the present system and method provides a single variable-rate image compression network that performs rate adaptation. In particular, the network includes a conditional autoencoder, conditioned on a Lagrange multiplier (i.e., the network takes the Lagrange multiplier as an input and produces a latent representation whose compression rates (e.g., bits per pixel (BPP) in image compression) depend on the input value. Moreover, the network is trained with mixed quantization bin sizes which allows for adaptation of the compression rate by adjusting the bin size applied to the quantization of a latent representation. Coarse compression rate adaptation to a target is achieved by varying the Lagrange multiplier in the conditional model, while fine compression rate adaptation is done by tuning the quantization bin size.

FIG. 1A illustrates a diagram of a variable-rate image compression model 100, according to an embodiment. A model 100 includes a conditional autoencoder 102, a conditional decoder 104, and a conditional entropy model 106. The autoencoder 102 is conditioned on the Lagrange multiplier $\lambda$ 108 that adapts the compression rate and optimizes the rate-distortion Lagrangian for various $\lambda$ values in one conditional model. The model 100 is trained for mixed values of the quantization bin size $\Delta$ 110 with universal quantization 111 so that the compression rate can be varied by changing $\Delta$ 110. The multiplier 108 is utilized in both the conditional entropy model 106 and the conditional decoder 104. The model 100 utilizes entropy encoding 112 and entropy decoding 114.

The present conditional autoencoder 102 receives a hyper-parameter (i.e., the Lagrange multiplier $\lambda$ 108) of the optimization problem as its conditioning variable. The present system and method solves multiple objectives using one conditional network, instead of solving the objectives individually using separate, non-conditional networks. The model 100 is based on a conditional autoencoder that does not need multiple iterations, while the quality is controlled by its conditioning variables $\lambda$ 108 and $\Delta$ 110.

Figure 1B:
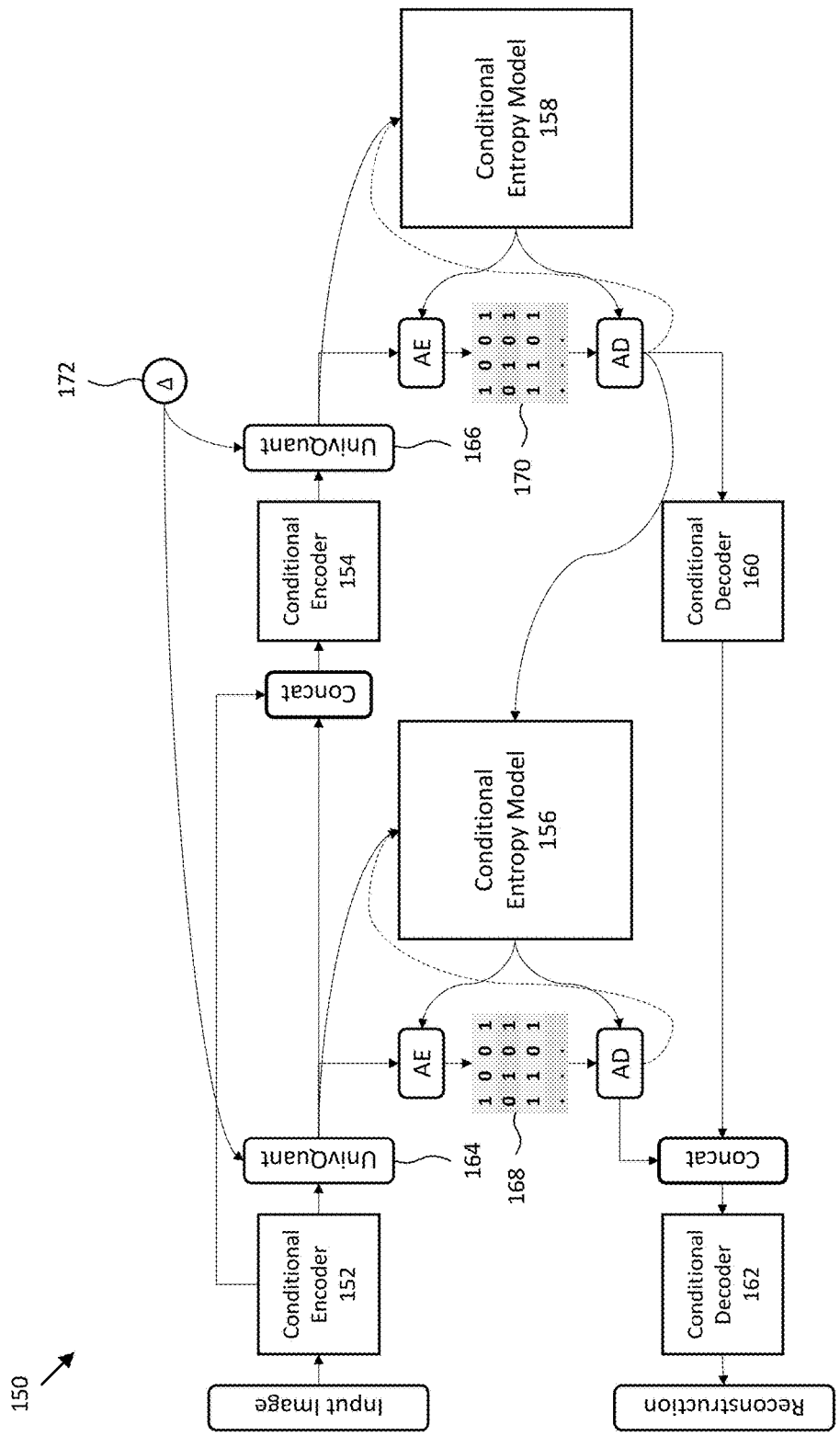
FIG. 1B illustrates a diagram of a variable-rate image compression model, according to an embodiment.

FIG. 1B illustrates a diagram of a variable-rate image compression model 150, according to an embodiment. The model 150 includes a first conditional auto encoder 152, a second conditional auto encoder 154, a first conditional entropy model 156, a second conditional entropy model 158, a first conditional auto decoder 160 and a second conditional auto decoder 162. The model 150 also includes a first universal quantization function 164 and a second universal quantization function 166, as well as a first arithmetic encoding (AE)/decoding (AD) function 168 and a second AE/AD function 170. The hyperparameter 172 is utilized at the universal quantization functions 164 and 166 as is described below With a autoencoder architecture including an encoder $f_\phi(x)$ and a decoder $g_\theta(z)$, where x is an input range and $z=\text{round}_\Delta(f_\phi(x))$ is a quantized latent representation encoded from the input x with a quantization bin size $\Delta$, where $\text{round}_\Delta(x)=\Delta\text{round}(x/\Delta)$. In the Equations below, $\Delta$ is fixed at 1. Lossless entropy source coding is used to generate a compressed bitstream from the quantized representation z. Taking the entropy source coding for the quantized latent variable z, and achieving its entropy rate, the compression rate R and the L2 distortion D (i.e., the MSE loss) are given by Equation (1):

$$R_\phi = \sum_z -P_\phi(z)\log_2 P_\phi(z),\quad (1)$$

$$D_{\phi,\theta} = E_{p(x)}[\|x - g_\theta(\text{round}_\Delta(f_\phi(x)))\|]$$

where as in Equation (2):

$$P_\phi(z) = \int p(x)\delta(z - \text{round}_\Delta(f_\phi(x)))dx \quad (2)$$

and p(x) is the probability density function of all natural images, and $P_\phi(z)$ is the probability mass function of z induced from encoder $f_\phi(x)$ and $\text{round}_\Delta$, which satisfies Equation (2), where $\delta$ denotes the Dirac delta function. Using the method of Lagrange multipliers, the R-D optimization problem is expressed as Equation (3):

$$\min_{\phi,\theta}\{D_{\phi,\theta} + \lambda R_\phi\} \quad (3)$$

for a fixed Lagrange multiplier $\lambda > 0$. The compression rate and the distortion provided in Equation (1) are not differentiable for network parameter $\phi$, due to $P_\phi(z)$ and $\text{round}_\Delta$, and thus it is not straightforward to optimize Equation (3).

According to one embodiment, the present system uses universal quantization. Universal quantization dithers every element in a latent representation $f_\phi(x)$ with one common uniform random variable as in Equation (4):

$$z = \text{round}_\Delta(f_\phi(x) + u) - u,\ u = [U, U, \ldots, U] \quad (4)$$

where the dithering vector u includes repetitions of a single uniform random variable U with support $[-\Delta/2, \Delta/2]$. The universal quantization is approximated as a linear function of the unit slope in the backpropagation of the network training. In each dimension, universal quantization is effectively identical in distribution to adding uniform noise, although the noise induced from universal quantization is dependent across dimensions.

Under the relaxation with universal quantization, similar to Equation (1), the compression rate and the distortion can be expressed as Equation (5):

$$R_\phi = E_{p(x)p_\phi(z|x)}[-\log_2 p_\phi(z)],$$

$$D_{\phi,\theta} = E_{p(x)p_\phi(z|x)}[\|x - g_\theta(\text{round}_\Delta(f_\phi(x)))\|_2^2] \quad (5)$$

where $p_\phi(z) = \int p(x)p_\phi(z|x)dx$. The compression rate is now a differential entropy, which is differentiable, but it is still usually intractable to compute $p_\phi(z)$. A tractable density function $q_\theta(z)$ is introduced and Equation (6) is derived as:

$$R_\phi = E_{p(x)p_\phi(z|x)}[-\log_2 p_\phi(z)] = E_{p(x)p_\phi(z|x)}[-\log_2 q_\theta(z)] - KL(p_\phi(z)\|q_\theta(z)) \leq E_{p(x)p_\phi(z|x)}[-\log_2 q_\theta(z)] \triangleq R_{\phi,\theta} \quad (6)$$

where KL denotes Kullback-Leibler divergence. The equality holds when $p_\phi(z) = q_\theta(z)$. Approximating $R_\phi$ by its upperbound $R_{\phi,\theta}$, the R-D optimization in Equation (3) reduces to Equation (7):

$$\min_{\phi,\theta} E_{p(x)p_\phi(z|x)}[\|x - g_\theta(z)\|_2^2 - \lambda \log_2 q_\theta(z)] \quad (7)$$

for fixed $\lambda > 0$. By optimizing a network for different values of $\lambda$, quality can be traded off against the compression rate. Using a smaller Lagrange multiplier $\lambda$, the trained network yields higher-quality images while using larger rates.

To adapt the quality and the compression rate of the compressed images, the system needs to optimize the R-D Lagrange function in Equation (7) for varying values of the Lagrange multiplier $\lambda$. Disclosed herein is a variable-rate model that can be deployed once and can be used to produce compressed images of varying quality with different rates, depending on the user's requirements, with no need of re-training.

Figure 2:
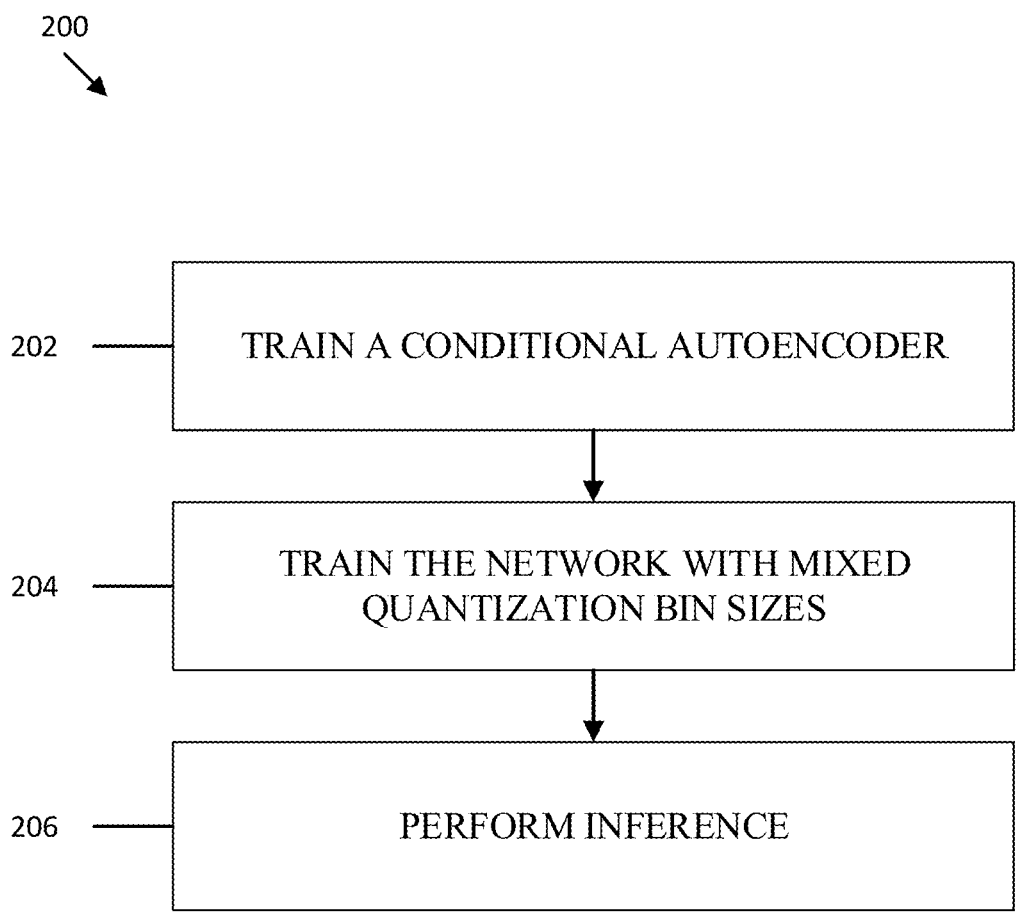
FIG. 2 illustrates a flowchart of a method for compression, according to an embodiment.

FIG. 2 illustrates a flowchart 200 of a method for compression, according to an embodiment. At 202, the system trains a conditional autoencoder. The system may train the conditional autoencoder conditioned on the Lagrange multiplier $\lambda$. The network receives $\lambda$ as a conditioning input parameter, along with the input image, and produces a compressed image with varying compression rate and distortion depending on the conditioning value of $\lambda$. Thus, the compression rate and distortion terms in Equations (5) and (6) are altered into Equations (8) and (9):

$$R_{\phi,\theta}(\lambda) = E_{p(x)p_\phi(z|x,\lambda)}[-\log_2 p_\phi(z|\lambda)] \quad (8)$$

$$D_{\phi,\theta}(\lambda) = E_{p(x)p_\phi(z|x,\lambda)}[\|x - g_\theta(z,\lambda)\|_2^2] \quad (9)$$

for $\lambda \in \Lambda$, where $\Lambda$ is a pre-defined finite set of Lagrange multiplier values.

Then, the combined objective function of Equation (10) is minimized.

$$\min_{\phi,\theta}\sum_{\lambda \in \Lambda}(D_{\phi,\theta}(\lambda) + \lambda R_\phi(\lambda)) \quad (10)$$

Figure 3:
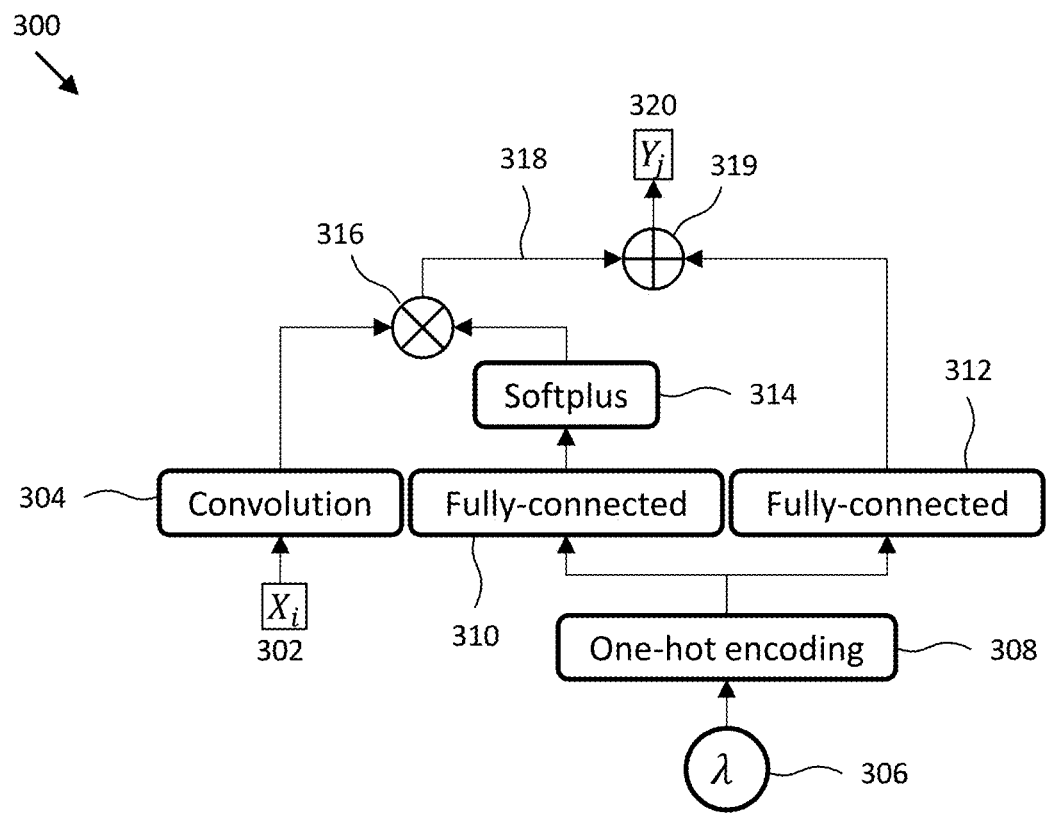
FIG. 3 illustrates a diagram of a conditional autoencoder, according to an embodiment.

FIG. 3 illustrates a diagram of a conditional autoencoder 300, according to an embodiment. To implement the conditional autoencoder, the conditional convolution is developed, conditioned on the Lagrange multiplier. The system sends the input 302 through a convolution layer 304 while the system sends the multiplier $\lambda$ 306 through a one-hot encoding layer 308, the output of which is then split as an input to a first fully-connected layer 310 and a second fully-connected layer 312. The system sends the output of the first fully-connected layer 310 to a softplus function block 314, the output of which is multiplied at 316 with the output of the convolution layer 304. The system then accumulates the multiplied output 318 and the output from the fully-connected layer 312 with the adder 319 to produce the output 320. The convolution is conditioned on the Lagrange multiplier $\lambda$ 306, which produces a different output depending on the input Lagrange multiplier $\lambda$ 306.

Specifically, referring to FIG. 3, $X_i$ is a 2-D input of channel i, $Y_j$ is a 2-D output of channel j, and $W_{i,j}$ is a 2-D convolutional kernel for input channel i and output channel j. The conditional convolution is given by Equation (11):

$$Y_j = s_j(\lambda)\sum_i X_i * W_{i,j} + b_j(\lambda) \quad (11)$$

where * denotes 2-D convolution. The channel-wise scaling factor and the additive bias term depend on $\lambda$ as in Equation (12):

$$s_j(\lambda) = \text{softplus}(u_j^T \text{onehot}(\lambda)),$$

$$b_j(\lambda) = v_j^T \text{onehot}(\lambda) \quad (12)$$

where $u_j^T$ and $v_j^T$ are the fully-connected layer weight vectors of length $|\Lambda|$ for output channel j, T denotes the transpose, and onehot($\lambda$) is one-hot encoding of $\lambda$ over $\Lambda$.

Referring to FIG. 2, at 204, the system trains the network with mixed quantization bin sizes. The above conditional autoencoder can obtain only finite discrete points in the R-D curve, since $\lambda$ is selected from a pre-determined finite set $\Lambda$. To extend the coverage to the whole continuous range of the R-D curve, another controlling aspect in the network is included to control the compression rate, i.e., the quantization bin size. In the R-D formulation in Equation (1), the quantization bin size was fixed to $\Delta=1$ (i.e., round was used for quantization). In actual inference, the bin size can be changed to adapt the compression rate, such that the larger the bin size, the lower the compression rate. However, the performance naturally suffers from mismatched bin sizes in training and inference, thus the system trains the network with mixed bin sizes.

During training, the system draws a uniform noise for various noise levels (for random $\Delta$). The range of $\Delta$ and the mixing distribution within the range are design choices. In one example, $\Delta=2^b$ was utilized, where b is uniformly drawn from $[-1,1]$ so $\Delta \in [0.5,2]$ is covered. The larger the range of b, the broader range of the R-D curve the network can be optimized for, although the performance may degrade. The optimization is solved as in Equation (13):

$$\min_{\phi,\theta} \sum_{\lambda \in \Lambda} E_{p(\Delta)}[D_{\phi,\theta}(\lambda, \Delta) + \lambda R_\phi(\lambda, \Delta)] \tag{13}$$

where $p(\Delta)$ is a pre-defined mixing density of $\Delta$, and as in Equation (14).

$$R_{\phi,\theta}(\lambda,\Delta) = E_{p(x)p_\phi(z|x,\lambda,\Delta)}[\log_2 p_\phi(z|\lambda,\Delta)],$$

$$D_{\phi,\theta}(\lambda,\Delta) = E_{p(x)p_\phi(z|x,\lambda,\Delta)}[\|x-g_\theta(z,\lambda)\|_2^2] \tag{14}$$

Referring to FIG. 2, at 206, the system performs inference. Regarding compression rate adaptation, the compression rate increases as the Lagrange multiplier and/or the quantization bin size decreases. Given a user's target compression rate, the system achieves large-scale discrete compression rate adaptation by changing the Lagrange multiplier, while the system can perform fine continuous compression rate adaptation by adjusting the quantization bin size for a fixed Lagrange multiplier.

Regarding compression, after selecting $\lambda \in \Lambda$, the system performs one-hot encoding of the Lagrange multiplier and uses it in all conditional convolutional layers to encode a latent representation of the input. The system performs regular deterministic quantization on the encoded representation with the selected quantization bin size. The system then encodes the quantized latent representation into a compressed bitstream with entropy encoding while storing the values of the conditional variables used in encoding.

Regarding decompression, the system decodes the compressed bitstream and retrieves the conditioning variables used in encoding from the compressed bitstream. The system restores the quantized latent representation from the decoder integer values by multiplying them with the quantization bin size. The system then feeds the restored latent representation to the decoder to reconstruct the image. The value of the Lagrange multiplier used in encoding is again used in all deconvolutional layers for conditional generation.

Figure 4:
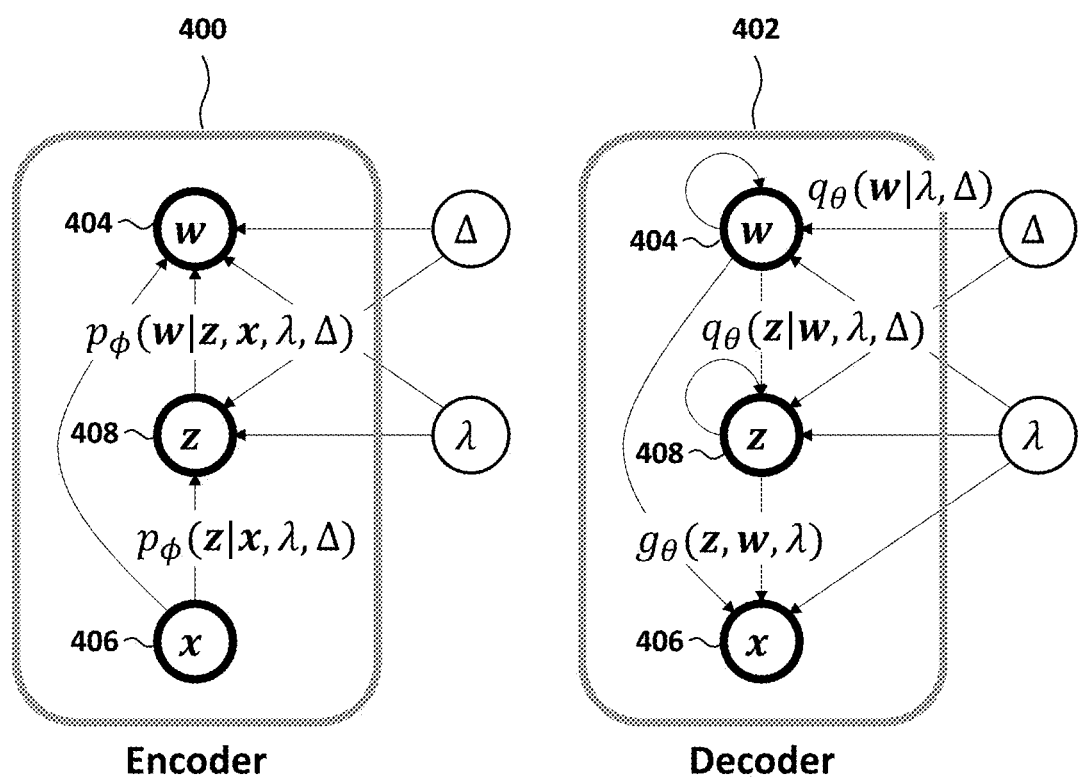
FIG. 4 illustrates a diagram of a refined variable-rate compression model, according to an embodiment.

FIG. 4 illustrates a diagram of a refined variable-rate compression model, according to an embodiment. In FIG. 4, an encoder 400 and a decoder 402 are depicted. The system refines the probability model by introducing a secondary latent variable w 404 that depends on x 406 and z 408. The rate and distortion terms given in Equation (13) are then given by Equation (14).

$$R_{\phi,\theta}(\lambda,\Delta) = E_{p(x)p_\phi(z|x,\lambda,\Delta)p_\phi(w|z,x,\lambda,\Delta)}[-\log_2 q_\phi(w|\lambda,\Delta)q_\phi(z|w,\lambda,\Delta)],$$

$$D_{\phi,\theta}(\lambda,\Delta) = E_{p(x)p_\phi(z|x,\lambda,\Delta)p_\phi(w|z,x,\lambda,\Delta)}[\|x-g_\theta(z,w,\lambda)\|_2^2] \tag{14}$$

For compression, the system encodes z 408 from x 406, and the further encodes w 404 from z(408),x(406). The encoded representations z 408, w 404 are entropy coded based on $q_\phi(w|\lambda,\Delta)$ and $q_\phi(z|w,\lambda,\Delta)$, respectively. For decompression, given $q_\phi(w|\lambda,\Delta)$, the system decodes w 404, which is then used to compute $q_\phi(z|w,\lambda,\Delta)$ and to decode z 408. This model is further refined by introducing autoregressive models for $q_\phi(w|\lambda,\Delta)$ and $q_\phi(z|w,\lambda,\Delta)$, as shown in Equation (15).

$$q_\phi(w|\lambda,\Delta) = \prod_i q_\phi(w_i|w_{<i},\lambda,\Delta), \tag{15}$$

$$q_\phi(z,w|\lambda,\Delta) = \prod_i q_\phi(z_i|z_{<i},w,\lambda,\Delta)$$

The system replaces a lossless source coding part of the encoded representations with lossy compress to adapt the rate. It is noted that any type of lossy compression codec may be used, including, but not limited to better portable graphics (BPG). By using lossy compression instead of lossless compression of encoded feature maps, the system may fine-tune the decoder for the lossy compression outputs to improve accuracy.

For BPG lossy compression, the system may rearrange the encoded feature maps into one gray-scale image. The system further compresses the rearranged gray-scale image as BPG lossy compression. For decompression, the system decompresses the feature maps from BPG, and then passes the decompressed feature maps to the decoder to get the decompressed image.

According to another embodiment, the system and method may be applied to a domain of wireless communication chipsets.

Figure 5:
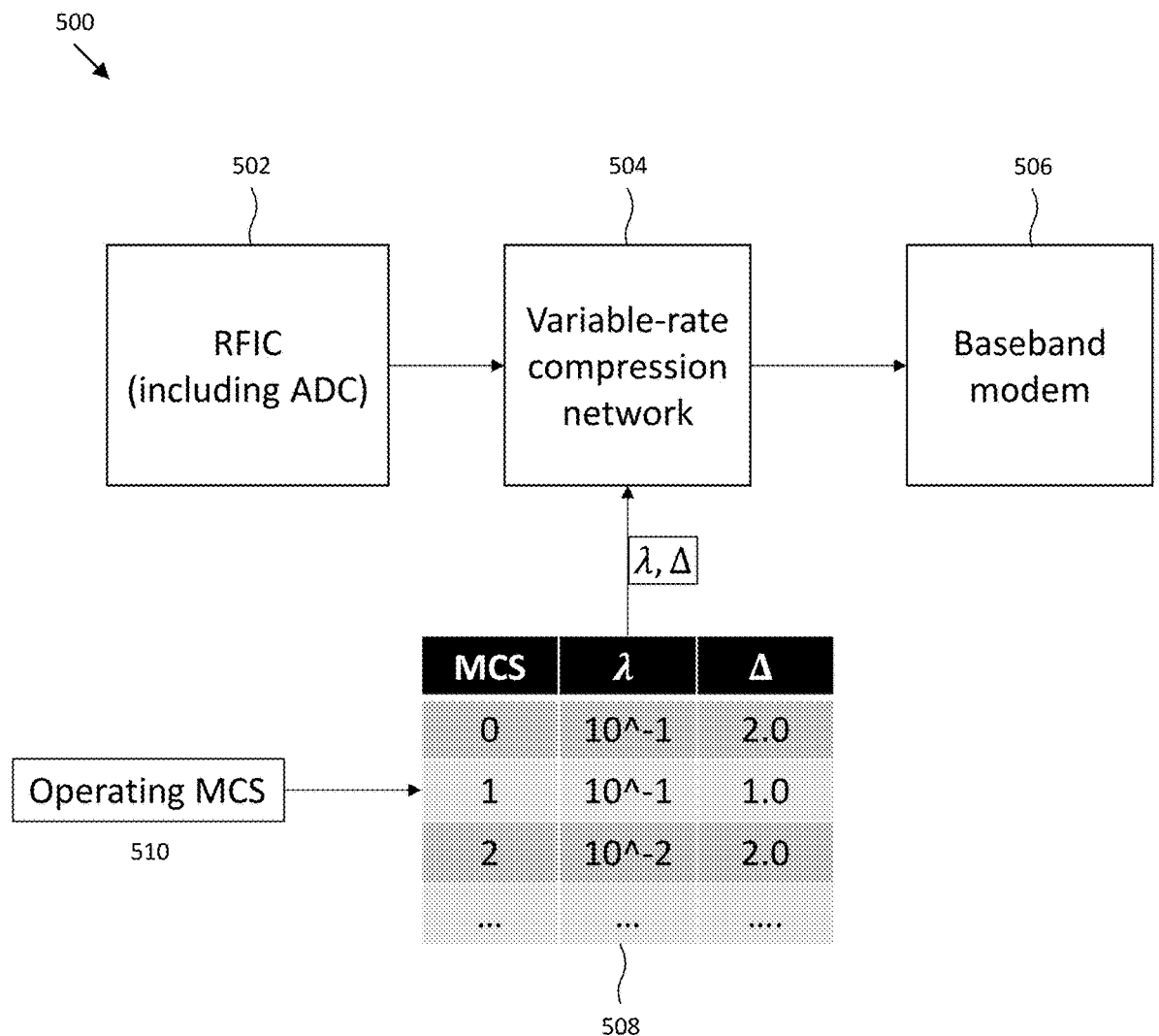
FIG. 5 illustrates a diagram of a system for radio frequency integrated circuit (RFIC) analog-to-digital output compression, according to an embodiment.

FIG. 5 illustrates a diagram of a system 500 for RFIC ADC output compression, according to an embodiment. The system includes an RFIC 502, a variable-rate compression network 504, a baseband modem 506, and a lookup table 508. The system adapts the compression rate (e.g., bits/subframe, bits/frame, bits/slot, etc.) based on a modulation coding scheme (MCS) 510, which is determined by the operating signal-to-noise ratio (SNR). The system may select the conditioning variables $\lambda,\Delta$ as a function of a MCS, which determines the compression rate and the distortion. Here, the distortion level may be below the operating SNR in order to avoid any performance degradation owing to compression. The system may include a lookup table 508 that maps MCS to $\lambda, \Delta$.

Figure 6:
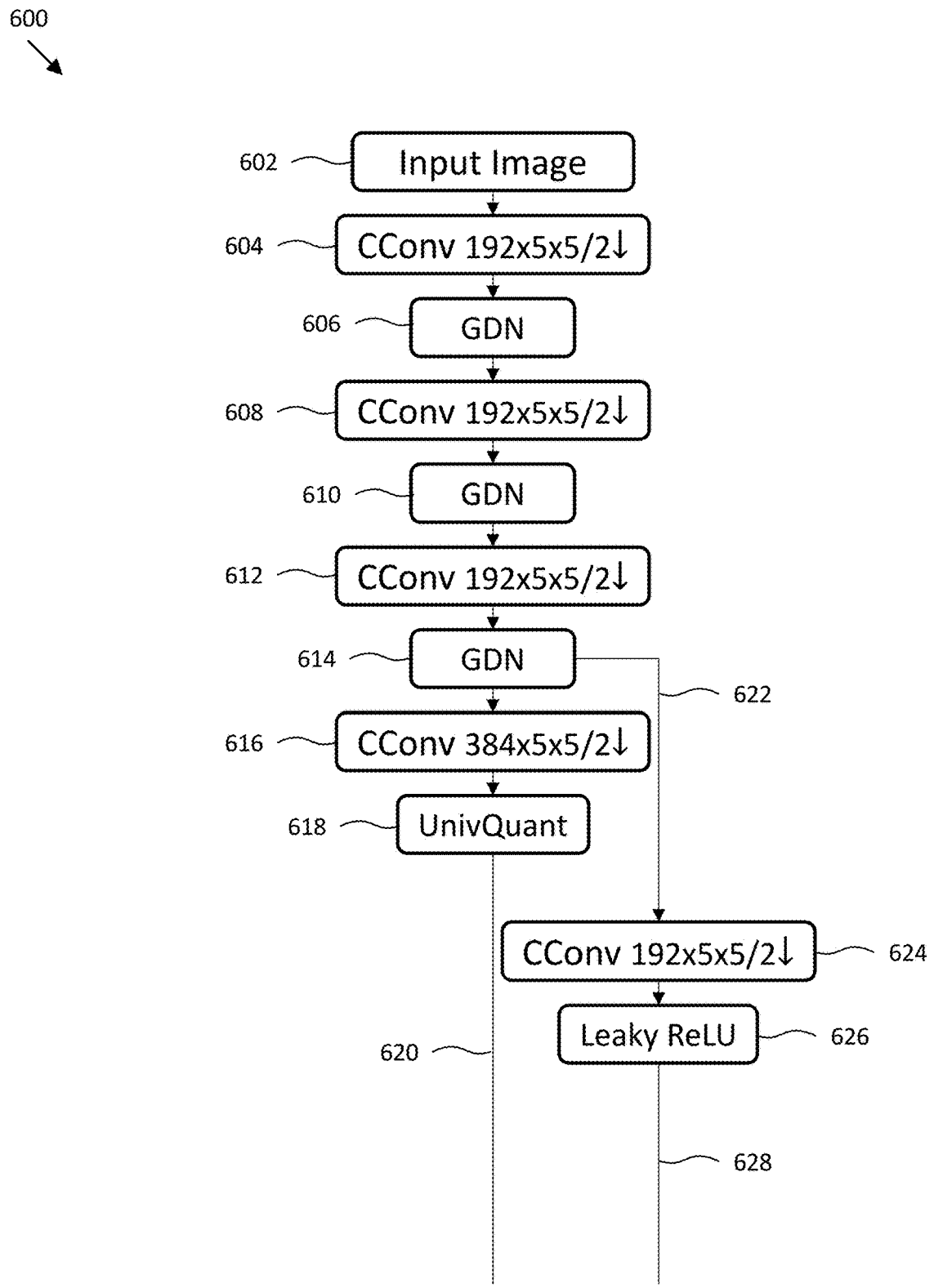
FIG. 6 illustrates a conditional encoder, according to an embodiment.

The system may apply the present variable-rate compression scheme to compress an analog-to-digital converter (ADC) 502 output of a radio frequency integrated circuit (RFIC). The system may compress the ADC 502 output with the compression network 504, and pass the compressed ADC output to a baseband (BB) modem 506 to reduce the communication cost (i.e., the bandwidth and/or the number of lanes) between RFIC and BB. The compression may be performed on every slot, every subframe, or every frame, depending on the affordable bandwidth and delay FIG. 6 illustrates a first conditional encoder 600, according to an embodiment. The conditional encoder 600 may be similar to the conditional encoder 102 depicted in FIG. 1A and the conditional encoder 152 depicted in FIG. 1B. An input (e.g., an image, ADC output, etc) 602 is provided the system processes the input 902 through a first 192×5×5/2 conditional convolution layer 604, a first generalized divisive normalization (GDN) layer 606, a second 192×5×5/2 conditional convolution layer 608, a second GDN layer 610, a third 192×5×5/2 conditional convolution layer 612, a third GDN layer 614, a 984×5×5/2 conditional convolution layer 616, and a universal quantization (UnivQuant) layer 610, which produces an output 820. The third GDN layer 614 produces an output 622 that is sent to a 192×5×5/2 conditional convolution layer 624, then to a leaky ReLU activation function 626, which produces an output 628.

Figure 7:
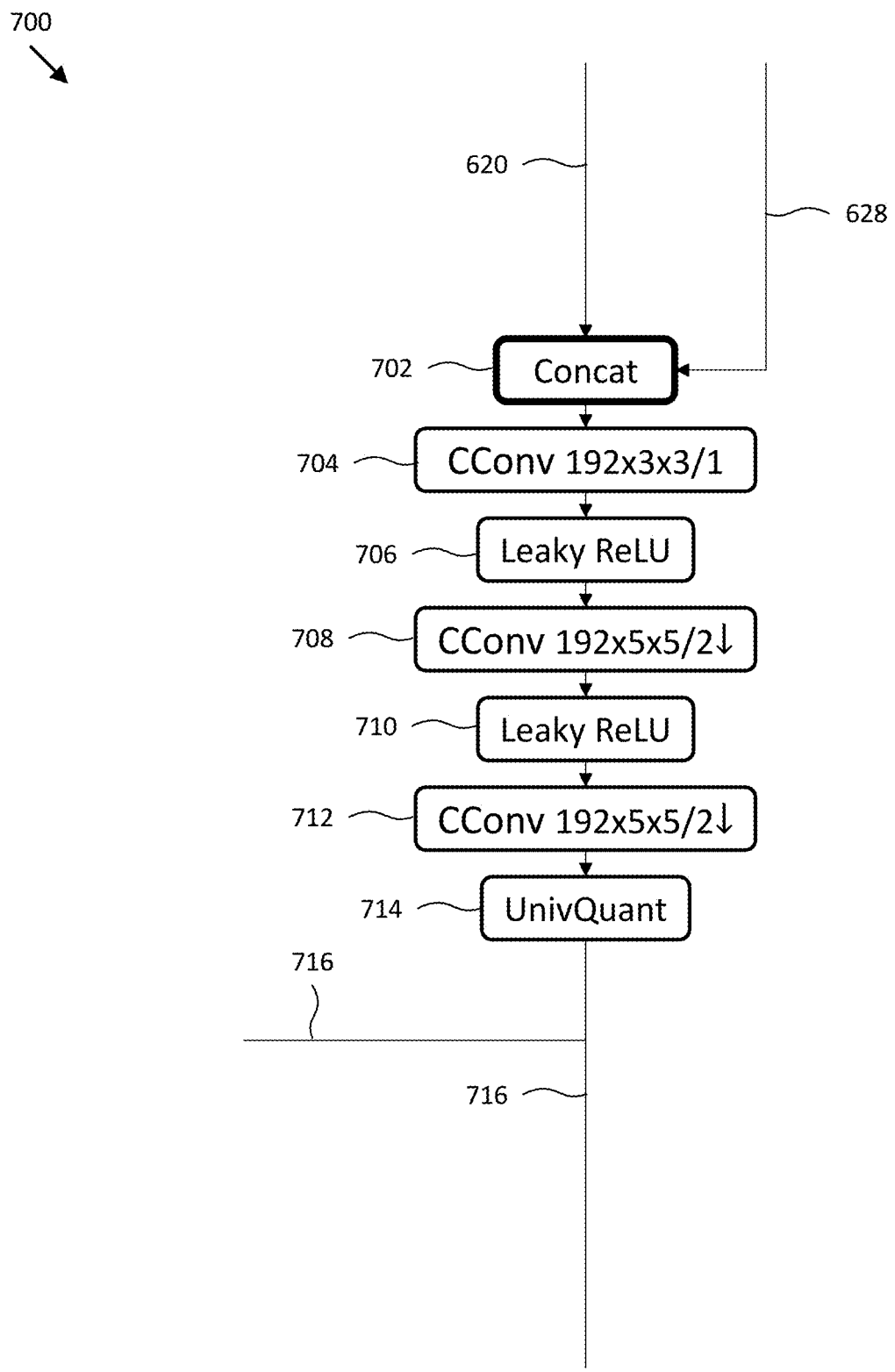
FIG. 7 illustrates a conditional encoder, according to an embodiment.

FIG. 7 illustrates a second conditional encoder 700, according to an embodiment. The second conditional encoder 700 may be similar to the conditional encoder 154 depicted in FIG. 1B. A concatenation (Concat) layer 702 receives the output 620 and the output 628, and the system produces an output that is processed by a 192×3×3/2 conditional convolution layer 704, a first leaky ReLU activation function 706, a first 192×5×5/2 conditional convolution layer 708, a second leaky ReLU activation function 710, a second 192×5×5/2 conditional convolution layer 712, and a UnivQuant layer 714, which produces an output 716.

Figure 8:
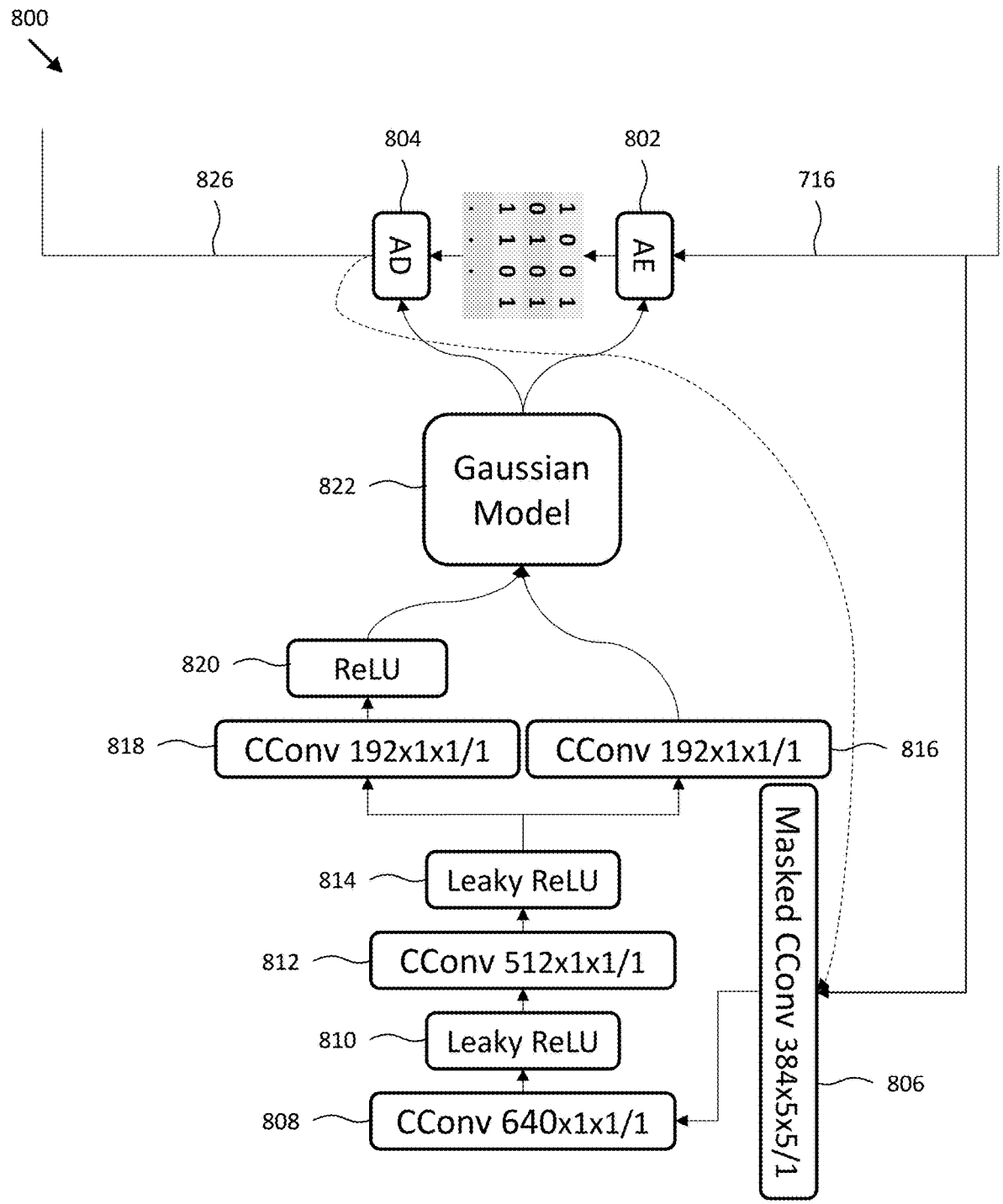
FIG. 8 illustrates a conditional entropy model, according to an embodiment.

FIG. 8 illustrates a conditional entropy model 800, according to an embodiment. The entropy model 800 may be the same or similar to the conditional entropy model 158 depicted in FIG. 1B. The entropy model 800 receives the output 716 which is processed through an AE 802 and an AD 804. The entropy model 800 processes the output 716 through a masked 384×5×5/1 conditional convolution layer 806, a 640×1×1/1 conditional convolution layer 808, a first leaky ReLU activation function 810, a 812×1×1/1 conditional convolution layer 812, and a second leaky ReLU activation function 814. The output of the ReLU function 814 is processed through a first 192×1×1/1 conditional convolution layer 816 as well as a second 192×1×1/1 conditional convolution layer 818. The output of the second conditional convolution layer 818 is processed through a third ReLU activation function 820, and the output of the first conditional convolution layer 816 and the ReLU function 820 are processed to produce the Gaussian model 822. The Gaussian model 822 is utilized with the AE 802 and the AD 804 to produce the output 826.

Figure 9:
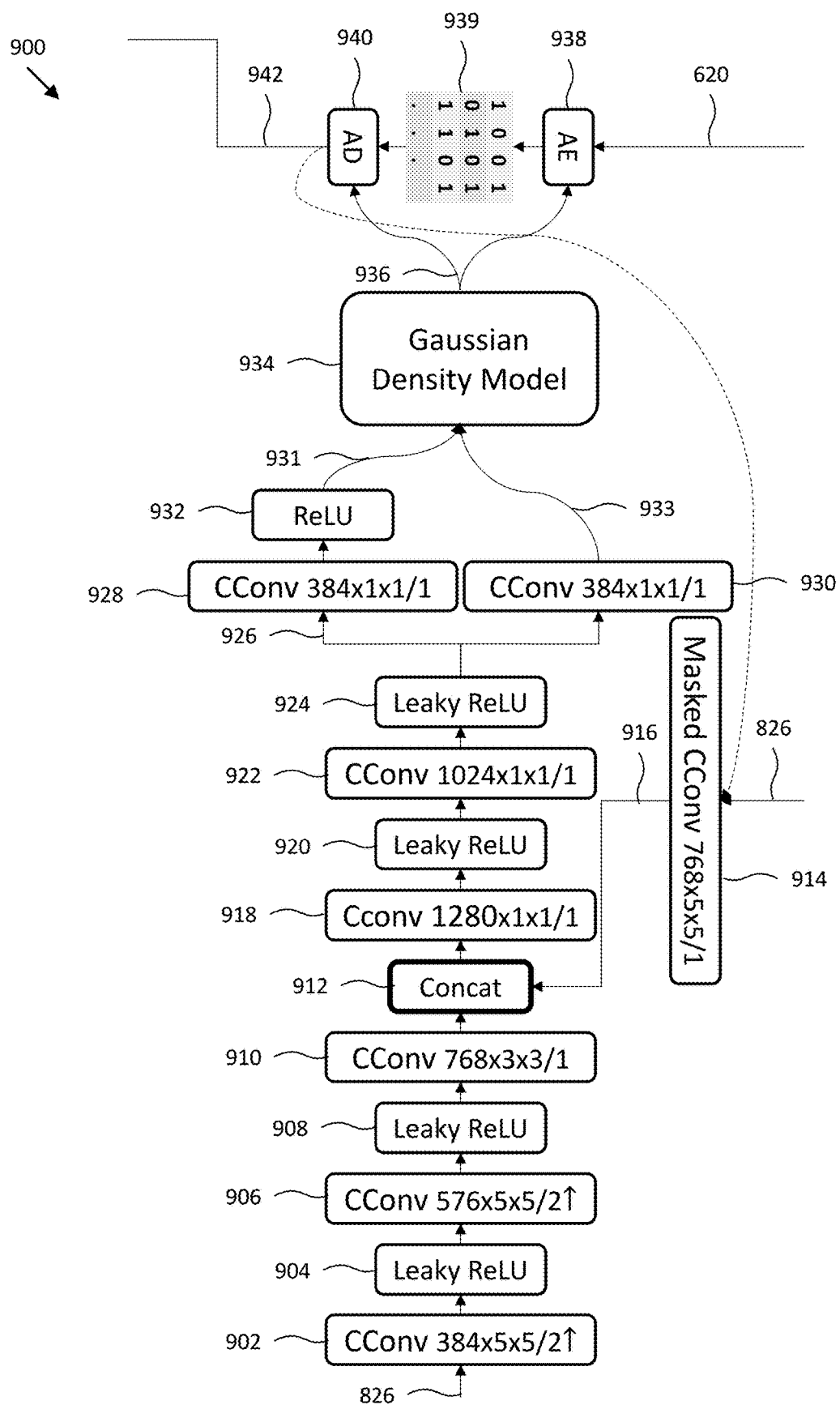
FIG. 9 illustrates a conditional entropy model, according to an embodiment.

FIG. 9 illustrates a conditional entropy model 900, according to an embodiment. The conditional entropy model 900 may be similar to the conditional entropy model 106 depicted at FIG. 1A and the conditional entropy model 156 illustrated in FIG. 1B. A masked 768×5×5/1 conditional convolution layer 914 receives input 826 and produces output 916. Furthermore, the system receives the output 826 and processes it through 684×5×5/2 conditional convolution layer 902, a first leaky ReLU activation function 904, a 576×5×5/2 conditional convolution layer 906, a second leaky ReLU activation function 908, and a 768×3×3/1 conditional convolution layer 610. The system processes the output of the layer 910 and the output 916 through a Concat function, which generates an output that is processed by a 1280×1×1/1 conditional convolution layer 918, a third leaky ReLU activation function 920, a 1024×1×1/1 conditional convolution layer 922, and a fourth leaky ReLU activation function 924 to produce out 926. The system then processes the output 926 through a first 384×1×1/1 conditional convolution layer 928 and a second 384×1×1/1 conditional convolution layer 930. The output of the first 384×1×1/1 conditional convolution layer 928 is processed through a ReLU activation function 932, and the output 931 of the ReLU activation function and the output 933 of the second 384×1×1/1 conditional convolution layer 930 and processed through a Gaussian density model 934.

The system processes the output 936 of the Gaussian density model 934 and the output 620 from the conditional encoder 600 with an autoencoder (AE) 938, which generates a signal that is processed through a quantization table 939. The system processes the output of the quantization table 939 and the output 936 of the Gaussian density model 934 with the decoder 940 to generate the output 942.

Figure 10:
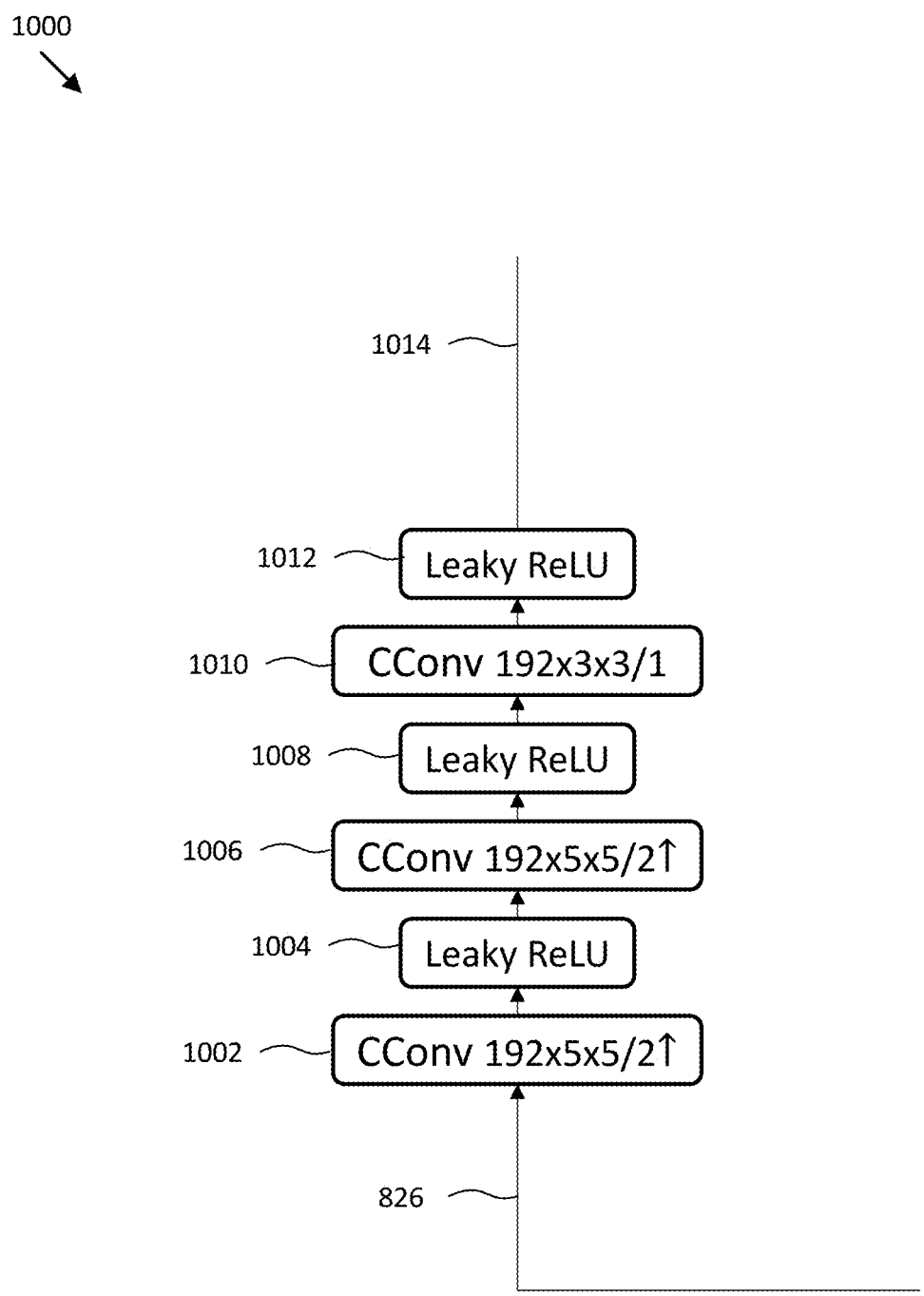
FIG. 10 illustrates a conditional decoder, according to an embodiment.

FIG. 10 illustrates a conditional decoder 1000, according to an embodiment.

The conditional decoder 1000 may be similar to the conditional decoder 160 depicted in FIG. 1B. The decoder 1000 receives the output 826 and processes it through a first 192×5×5/2 conditional convolution layer 1002, a first leaky ReLU activation function 1004, a second 192×5×5/2 conditional convolution layer 1006, a second leaky ReLU activation function 1008, a 192×3×3 conditional convolution layer 1010 and a third leaky ReLY activation function 1012 to produce output 1014.

Figure 11:
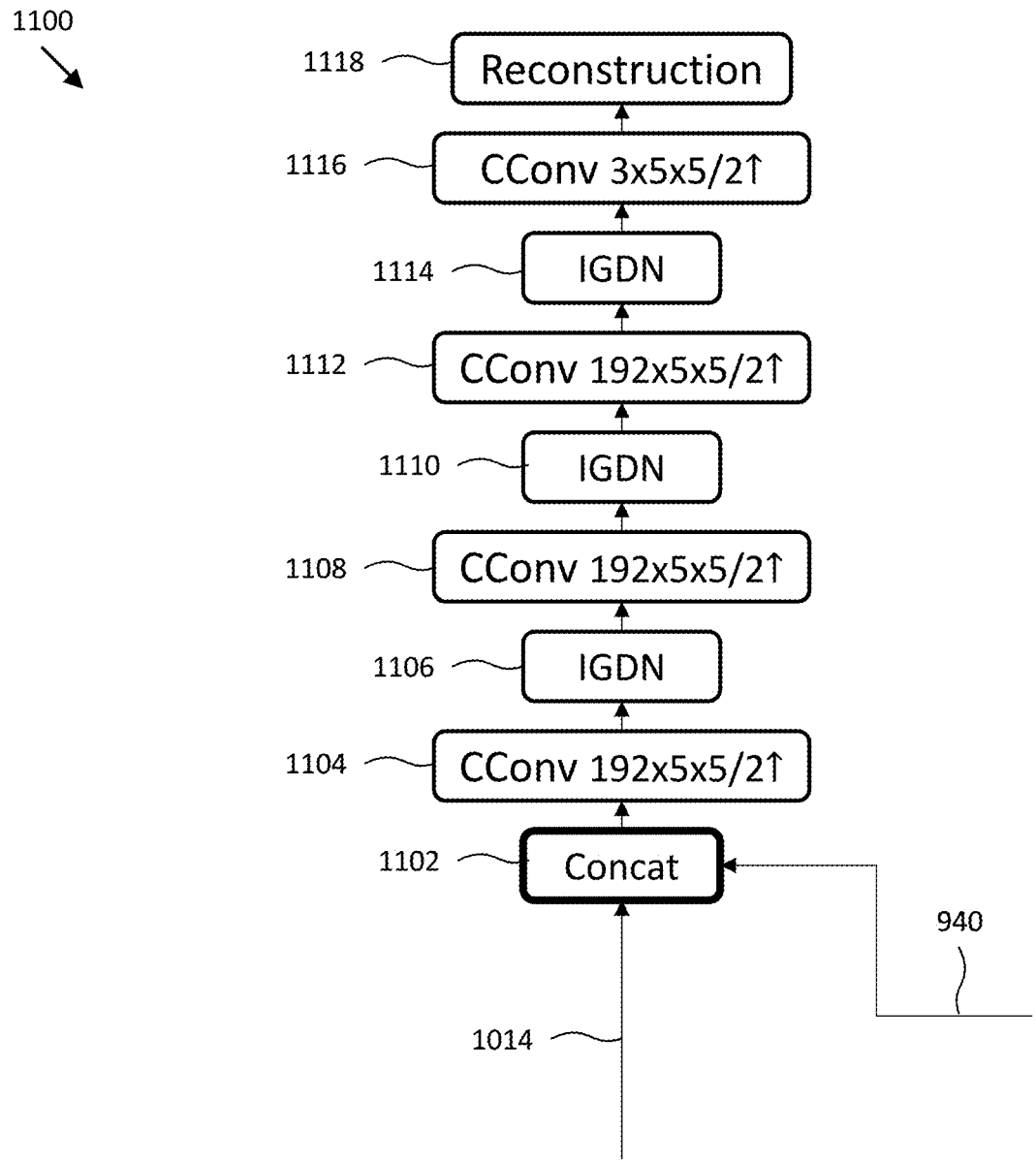
FIG. 11 illustrates a conditional decoder, according to an embodiment.

FIG. 11 illustrates a conditional decoder 1100, according to an embodiment.

The conditional decoder 1100 may be similar to the decoder 104 depicted in FIG. 1A and the decoder 162 depicted in FIG. 1B. The decoder receives the output 1014 and the output 940 and processes the outputs at a concat function 1102. The system processes the output of the concat function 1102 to a first 192×5×5/2 conditional convolution layer 1104, a first inverse generalized divisive normalization (IGDN) layer 1106, a second 192×5×5/2 conditional convolution layer 1108, a second IGDN layer 1110, a third 192×5×5/2 conditional convolution layer 1112, a third IGDN layer 1114 and a 3×5×5/2 conditional convolution layer 1116 to produce a reconstructed input 1118.

Figure 12:
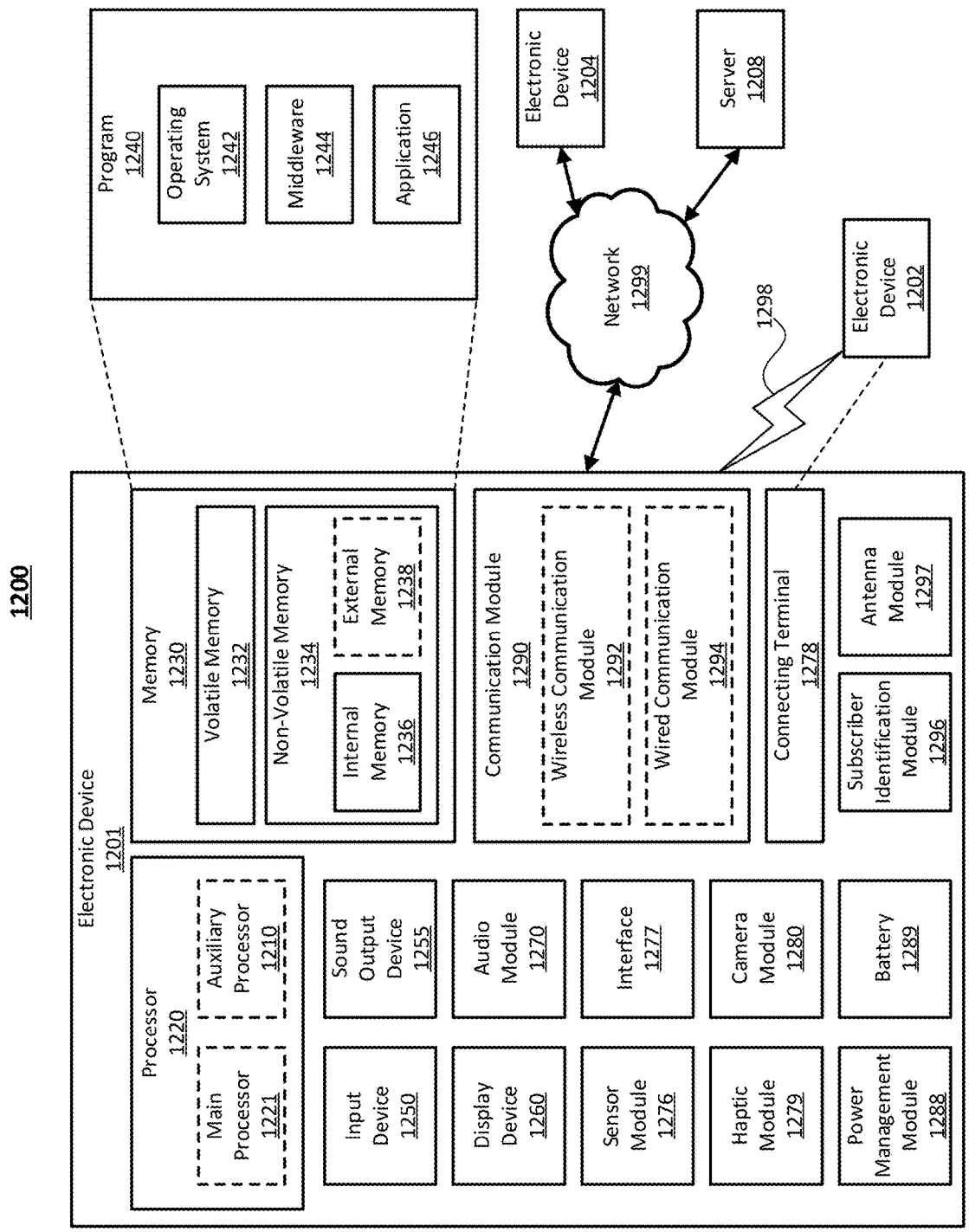
FIG. 12 illustrates a block diagram of an electronic device in a network environment, according to one embodiment.

FIG. 12 illustrates an electronic device 1201 in a network environment 1100, according to one embodiment. Referring to FIG. 12, the electronic device 1201 in the network environment 1200 may communicate with an electronic device 1202 via a first network 1298 (e.g., a short-range wireless communication network), or an electronic device 1204 or a server 1208 via a second network 1299 (e.g., a long-range wireless communication network). The electronic device 1201 may communicate with the electronic device 1204 via the server 1208. The electronic device 1201 may include a processor 1220, a memory 1230, an input device 1250, a sound output device 1255, a display device 1260, an audio module 1270, a sensor module 1276, an interface 1277, a haptic module 1279, a camera module 1280, a power management module 1288, a battery 1289, a communication module 1290, a subscriber identification module (SIM) 1296, or an antenna module 1297. In one embodiment, at least one (e.g., the display device 1260 or the camera module 1280) of the components may be omitted from the electronic device 1201, or one or more other components may be added to the electronic device 1201. In one embodiment, some of the components may be implemented as a single integrated circuit (IC). For example, the sensor module 1276 (e.g., a fingerprint sensor, an iris sensor, or an illuminance sensor) may be embedded in the display device 1260 (e.g., a display).

The processor 1220 may execute, for example, software (e.g., a program 1240) to control at least one other component (e.g., a hardware or a software component) of the electronic device 1201 coupled with the processor 1220, and may perform various data processing or computations. As at least part of the data processing or computations, the processor 1220 may load a command or data received from another component (e.g., the sensor module 1276 or the communication module 1290) in volatile memory 1232, process the command or the data stored in the volatile memory 1232, and store resulting data in non-volatile memory 1234. The processor 1220 may include a main processor 1221 (e.g., a central processing unit (CPU) or an application processor (AP)), and an auxiliary processor 1223 (e.g., a graphics processing unit (GPU), an image signal processor (ISP), a sensor hub processor, or a communication processor (CP)) that is operable independently from, or in conjunction with, the main processor 1221. Additionally or alternatively, the auxiliary processor 1223 may be adapted to consume less power than the main processor 1221, or execute a particular function. The auxiliary processor 1223 may be implemented as being separate from, or a part of, the main processor 1221.

The auxiliary processor 1223 may control at least some of the functions or states related to at least one component (e.g., the display device 1260, the sensor module 1276, or the communication module 1290) among the components of the electronic device 1201, instead of the main processor 1221 while the main processor 1221 is in an inactive (e.g., sleep) state, or together with the main processor 1221 while the main processor 1221 is in an active state (e.g., executing an application). According to one embodiment, the auxiliary processor 1223 (e.g., an image signal processor or a communication processor) may be implemented as part of another component (e.g., the camera module 1280 or the communication module 1290) functionally related to the auxiliary processor 1223.

The memory 1230 may store various data used by at least one component (e.g., the processor 1220 or the sensor module 1276) of the electronic device 1201. The various data may include, for example, software (e.g., the program 1240) and input data or output data for a command related thereto. The memory 1230 may include the volatile memory 1232 or the non-volatile memory 1234.

The program 1240 may be stored in the memory 1230 as software, and may include, for example, an operating system (OS) 1242, middleware 1244, or an application 1246.

The input device 1250 may receive a command or data to be used by other component (e.g., the processor 1220) of the electronic device 1201, from the outside (e.g., a user) of the electronic device 1201. The input device 1250 may include, for example, a microphone, a mouse, or a keyboard.

The sound output device 1255 may output sound signals to the outside of the electronic device 1201. The sound output device 1255 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 1260 may visually provide information to the outside (e.g., a user) of the electronic device 1201. The display device 1260 may include, for example, a display, a hologram device, or a projector and control circuitry to control a corresponding one of the display, hologram device, and projector. According to one embodiment, the display device 1260 may include touch circuitry adapted to detect a touch, or sensor circuitry (e.g., a pressure sensor) adapted to measure the intensity of force incurred by the touch.

The audio module 1270 may convert a sound into an electrical signal and vice versa. According to one embodiment, the audio module 1270 may obtain the sound via the input device 1250, or output the sound via the sound output device 1255 or a headphone of an external electronic device 1202 directly (e.g., wired) or wirelessly coupled with the electronic device 1201.

The sensor module 1276 may detect an operational state (e.g., power or temperature) of the electronic device 1201 or an environmental state (e.g., a state of a user) external to the electronic device 1201, and then generate an electrical signal or data value corresponding to the detected state. The sensor module 1276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1277 may support one or more specified protocols to be used for the electronic device 1201 to be coupled with the external electronic device 1202 directly (e.g., wired) or wirelessly. According to one embodiment, the interface 1277 may include, for example, a high definition multimedia interface (HDMI), a universal serial bus (USB) interface, a secure digital (SD) card interface, or an audio interface.

A connecting terminal 1278 may include a connector via which the electronic device 1201 may be physically connected with the external electronic device 1202. According to one embodiment, the connecting terminal 1278 may include, for example, an HDMI connector, a USB connector, an SD card connector, or an audio connector (e.g., a headphone connector).

The haptic module 1279 may convert an electrical signal into a mechanical stimulus (e.g., a vibration or a movement) or an electrical stimulus which may be recognized by a user via tactile sensation or kinesthetic sensation. According to one embodiment, the haptic module 1279 may include, for example, a motor, a piezoelectric element, or an electrical stimulator.

The camera module 1280 may capture a still image or moving images. According to one embodiment, the camera module 1280 may include one or more lenses, image sensors, image signal processors, or flashes.

The power management module 1288 may manage power supplied to the electronic device 1201. The power management module 1288 may be implemented as at least part of, for example, a power management integrated circuit (PMIC).

The battery 1289 may supply power to at least one component of the electronic device 1201. According to one embodiment, the battery 1289 may include, for example, a primary cell which is not rechargeable, a secondary cell which is rechargeable, or a fuel cell.

The communication module 1290 may support establishing a direct (e.g., wired) communication channel or a wireless communication channel between the electronic device 1201 and the external electronic device (e.g., the electronic device 1202, the electronic device 1204, or the server 1208) and performing communication via the established communication channel. The communication module 1290 may include one or more communication processors that are operable independently from the processor 1220 (e.g., the AP) and supports a direct (e.g., wired) communication or a wireless communication. According to one embodiment, the communication module 1290 may include a wireless communication module 1292 (e.g., a cellular communication module, a short-range wireless communication module, or a global navigation satellite system (GNSS) communication module) or a wired communication module 1294 (e.g., a local area network (LAN) communication module or a power line communication (PLC) module). A corresponding one of these communication modules may communicate with the external electronic device via the first network 1298 (e.g., a short-range communication network, such as Bluetooth™, wireless-fidelity (Wi-Fi) direct, or a standard of the Infrared Data Association (IrDA)) or the second network 1299 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 1292 may identify and authenticate the electronic device 1201 in a communication network, such as the first network 1298 or the second network 1299, using subscriber information (e.g., international mobile subscriber identity (IMSI)) stored in the subscriber identification module 1296.

The antenna module 1297 may transmit or receive a signal or power to or from the outside (e.g., the external electronic device) of the electronic device 1201. According to one embodiment, the antenna module 1297 may include one or more antennas, and, therefrom, at least one antenna appropriate for a communication scheme used in the communication network, such as the first network 1298 or the second network 1299, may be selected, for example, by the communication module 1290 (e.g., the wireless communication module 1292). The signal or the power may then be transmitted or received between the communication module 1290 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 1201 and the external electronic device 1204 via the server 1208 coupled with the second network 1299. Each of the electronic devices 1202 and 1204 may be a device of a same type as, or a different type, from the electronic device 1201. All or some of operations to be executed at the electronic device 1201 may be executed at one or more of the external electronic devices 1202, 1204, or 1208. For example, if the electronic device 1201 should perform a function or a service automatically, or in response to a request from a user or another device, the electronic device 1201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1201. The electronic device 1201 may provide the outcome, with or without further processing of the outcome, as at least part of a reply to the request. To that end, a cloud computing, distributed computing, or client-server computing technology may be used, for example.

One embodiment may be implemented as software (e.g., the program 1240) including one or more instructions that are stored in a storage medium (e.g., internal memory 1236 or external memory 1238) that is readable by a machine (e.g., the electronic device 1201). For example, a processor of the electronic device 1101 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a compiler or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A method for compression, comprising:
    training a conditional autoencoder using a Lagrange multiplier; and
    training a neural network that includes the conditional autoencoder with mixed quantization bin sizes.

2. The method of claim 1, wherein a value of the Lagrange multiplier is selected from a predetermined set of values.

3. The method of claim 1, wherein the neural network produces a compressed out with varying compression rate and distortion depending on the conditioning value of the Lagrange multiplier.

4. The method of claim 1, wherein the conditional autoencoder is trained using conditional convolution.

5. The method of claim 1, wherein training the network with mixed quantization bin sizes further comprises adjusting the quantization bin size.

6. The method of claim 1, wherein training the network with mixed quantization bin sizes further comprises drawing a uniform noise for various noise levels for random quantization bin sizes.

7. The method of claim 1, wherein the neural network is configured to perform better portable graphics (BPG) compression.

8. The method of claim 1, wherein the neural network is configured to perform compression of an analog-to-digital output of a radio frequency integrated circuit (RFIC).

9. The method of claim 8, further comprising selecting a Lagrange multiplier and the quantization bin size as a function of a modulation coding scheme (MCS).

10. The method of claim 9, wherein the neural network further includes a lookup table that maps the MCS to the Lagrange multiplier and the quantization bin size.

11. A system, comprising:
a neural network including a conditional autoencoder; and
a processor configured to:
train the conditional autoencoder using a Lagrange multiplier; and
train the neural network using mixed quantization bin sizes.

12. The system of claim 11, wherein a value of the Lagrange multiplier is selected from a predetermined set of values.

13. The system of claim 11, wherein the neural network produces a compressed out with varying compression rate and distortion depending on the conditioning value of the Lagrange multiplier.

14. The system of claim 11, wherein the processor is configured to train the conditional autoencoder using conditional convolution.

15. The system of claim 11, wherein the processor is further configured to train the network with mixed quantization bin sizes by adjusting the quantization bin size.

16. The system of claim 11, wherein the processor is further configured to train the network with mixed quantization bin sizes by drawing a uniform noise for various noise levels for random quantization bin sizes.

17. The system of claim 11, wherein the neural network is configured to perform better portable graphics (BPG) compression.

18. The system of claim 11, wherein the neural network is configured to perform compression of an analog-to-digital converter output of a radio frequency integrated circuit (RFIC).

19. The system of claim 18, wherein the processor is further configured to select a Lagrange multiplier and the quantization bin size as a function of a modulation coding scheme (MCS).

20. The system of claim 19, wherein the neural network further includes a lookup table that maps the MCS to the Lagrange multiplier and the quantization bin size.

* * * * *